United States Patent
Hong et al.

(10) Patent No.: US 10,761,728 B2
(45) Date of Patent: Sep. 1, 2020

(54) MEMORY CONTROLLER AND METHOD OF OPERATING THE SAME

(71) Applicant: SK hynix Inc., Gyeonggi-do (KR)

(72) Inventors: Sung Kwan Hong, Seoul (KR); Yeong Sik Yi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 79 days.

(21) Appl. No.: 16/215,121

(22) Filed: Dec. 10, 2018

(65) Prior Publication Data

US 2019/0303007 A1 Oct. 3, 2019

(30) Foreign Application Priority Data

Mar. 28, 2018 (KR) ........................ 10-2018-0036108

(51) Int. Cl.
| | | |
|---|---|---|
| *G06F 13/00* | (2006.01) | |
| *G06F 3/06* | (2006.01) | |
| *G06F 12/0802* | (2016.01) | |
| *G11C 16/04* | (2006.01) | |
| *G11C 16/10* | (2006.01) | |

(52) U.S. Cl.
CPC .......... *G06F 3/0604* (2013.01); *G06F 3/0655* (2013.01); *G06F 3/0673* (2013.01); *G06F 12/0802* (2013.01); *G06F 2212/60* (2013.01); *G11C 16/0483* (2013.01); *G11C 16/10* (2013.01)

(58) Field of Classification Search
CPC ..... G06F 3/0604; G06F 3/0655; G06F 9/3857
See application file for complete search history.

(56) References Cited

U.S. PATENT DOCUMENTS

| | | | |
|---|---|---|---|
| 6,581,155 B1* | 6/2003 | Lohman ................ | G06F 9/3001 712/222 |
| 6,907,518 B1* | 6/2005 | Lohman ................ | G06F 9/3001 712/212 |
| 2011/0145489 A1* | 6/2011 | Yu ......................... | G06F 3/0656 711/103 |
| 2018/0011633 A1* | 1/2018 | Park ...................... | G06F 3/0655 |
| 2019/0187918 A1* | 6/2019 | Lee ....................... | G06F 3/0679 |

FOREIGN PATENT DOCUMENTS

| | | |
|---|---|---|
| KR | 1020090102192 | 9/2009 |
| KR | 1020100082185 | 7/2010 |

* cited by examiner

*Primary Examiner* — Sean D Rossiter
(74) *Attorney, Agent, or Firm* — IP & T Group LLP

(57) ABSTRACT

Provided herein may be a memory controller and a method of operating the same. The memory controller may include a command processor configured to generate a flush command in response to a flush request input from an external host and to assign a slot number corresponding to the flush command; a sequence generator configured to determine flush data to be stored in response to the flush command, and to generate a write sequence in which the flush data is to be stored based on a size of the flush data and an assigned device sequence of the plurality of memory devices; and a memory operation controller configured to control the plurality of memory devices to store the flush data in the plurality of memory devices.

16 Claims, 13 Drawing Sheets

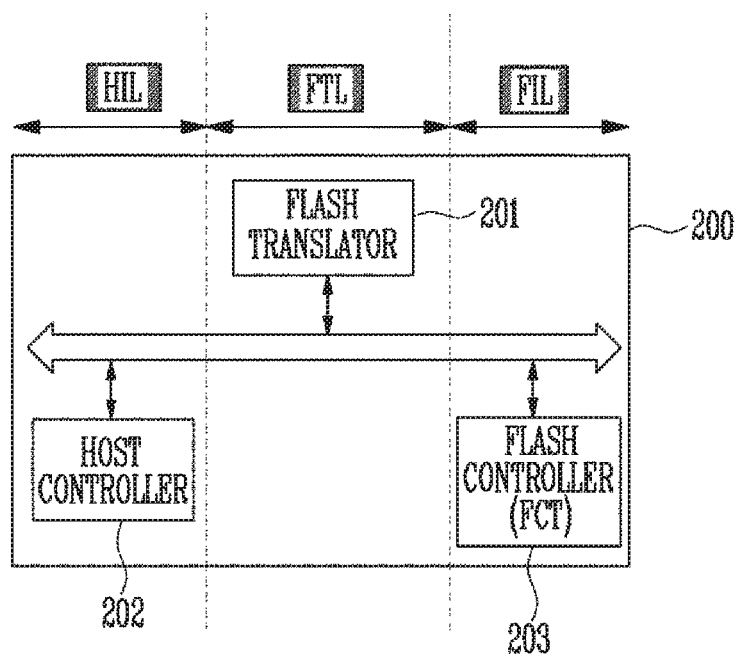

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2018-0036108, filed on Mar. 28, 2018, which is incorporated herein by reference in its entirety.

BACKGROUND

1. Field of Invention

Various embodiments of the present disclosure generally relate to an electronic device. Particularly, the embodiments relate to a memory controller and a method of operating the memory controller.

2. Description of Related Art

A storage device is a device which stores data under the control of a host device such as a computer, a smartphone, or a smartpad. Examples of the storage device include devices such as a hard disk drive (HDD) which stores data in a magnetic disk, a solid state drive (SSD), or a memory card which stores data in a semiconductor memory, particularly, a nonvolatile memory, according to the device which stores data.

The storage device may include a memory device in which data is stored and a memory controller which controls the storage of data in the memory device. Memory devices may be classified into a volatile memory and a nonvolatile memory. Representative examples of the nonvolatile memory include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a memory controller for processing a flush request, and a method of operating the memory controller.

An embodiment of the present disclosure may provide for a memory controller for controlling a plurality of memory devices. The memory controller may include a command processor configured to generate a flush command in response to a flush request input from an external host and to assign a slot number corresponding to the flush command; a sequence generator configured to determine flush data, which is data to be stored in response to the flush command, among pieces of write data stored in a write cache buffer, and to generate a write sequence in which the flush data is to be stored based on a size of the flush data and an assigned device sequence of the plurality of memory devices; and a memory operation controller configured to control the plurality of memory devices so that program operations of storing the flush data in the plurality of memory devices are performed depending on the write sequence, and to provide the slot number corresponding to the flush command to the command processor.

An embodiment of the present disclosure may provide for a method of operating a memory controller for controlling a plurality of memory devices. The method may include generating a flush command in response to a flush request received from an external host and assigning a slot number to the flush command; determining flush data that is data to be stored in the plurality of memory devices in response to the flush command; generating a write sequence in which the flush data is to be stored based on a size of the flush data and an assigned device sequence of the plurality of memory devices; and controlling the plurality of memory devices so that program operations of storing the flush data in the plurality of memory devices are performed depending on the write sequence.

An embodiment of the present disclosure may provide for a method of operating a memory system. The method may include buffering, in response to one or more requests, one or more commands respectively having a command sequence; buffering write data; identifying, in response to a flush request, as flush data the buffered write data corresponding to one or more buffered write commands before in the command sequence a buffered flush command corresponding to the flush request; selecting one or more among a plurality of memory devices based on a size of the flush data, the memory devices having a device sequence; and controlling the selected memory devices to perform a flush operation with the flush data according to the device sequence in response to the buffered flush command.

BRIEF DESCRIPTION OF THE DRAWINGS

FIG. 4 is a diagram illustrating an example in which the configuration of the memory controller of FIG. 1 is functionally divided.

DETAILED DESCRIPTION

Figure 1:
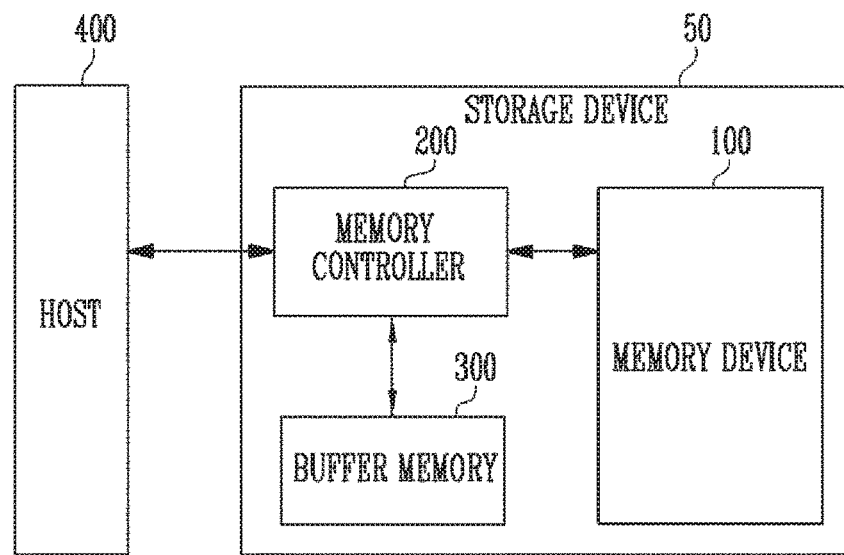
FIG. 1 is a block diagram illustrating a storage device according to an embodiment of the present disclosure.

Specific structural or functional descriptions in the embodiments of the present disclosure introduced in this specification or application are only for description of the embodiments of the present disclosure. The descriptions should not be construed as being limited to the embodiments described in the specification or application.

The present disclosure will now be described in more detail based on embodiments described in this disclosure. The present disclosure may, however, be embodied in many different forms and should not be construed as being limited to only the embodiments set forth herein, but should be construed as covering modifications, equivalents or alternatives falling within ideas and technical scopes of the present invention. The embodiments described is not intended to limit the present disclosure to particular modes of practice, and it is to be appreciated that all changes, equivalents, and substitutes that do not depart from the spirit and technical scope of the present disclosure are encompassed in the present disclosure. Rather, the described embodiments are provided so that this disclosure will be thorough and complete, and will fully convey the present invention to those skilled in the art to which this invention pertains. It is noted that reference to "an embodiment" does not necessarily mean only one embodiment, and different references to "an embodiment" are not necessarily to the same embodiment(s).

Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein. That is, the terminology used herein is for the purpose of describing particular embodiments only and is not intended to be limiting of the present invention.

As used herein, singular forms may include the plural forms as well and vice versa, unless the context clearly indicates otherwise.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are illustrated, so that those of ordinary skill in the art can easily carry out the technical idea of the present disclosure.

FIG. 1 is a block diagram illustrating a storage device 50 according to an embodiment of the present disclosure.

Referring to FIG. 1, the storage device 50 may include a memory device 100, a memory controller 200, and a buffer memory 300.

Non-limiting examples of the storage device 50 may include devices such as a mobile phone, a smartphone, an MP3 player, a laptop computer, a desktop computer, a game console, a TV, a tablet PC, or an in-vehicle infotainment system, which stores data under the control of a host 400.

The memory device 100 may store data. The memory device 100 is operated in response to the control of the memory controller 200. The memory device 100 may include a memory cell array including a plurality of memory cells which store data. The memory cell array may include a plurality of memory blocks. Each memory block may include a plurality of memory cells. A single memory block may include a plurality of pages. In an embodiment, each page may be a unit by which data is stored in the memory device 100 or by which data stored in the memory device 100 is read. A memory block may be a unit by which data is erased. By way of example and not limitation, depending on an embodiment, the memory device 100 may be implemented in various forms such as a double data rate synchronous dynamic random access memory (DDR SDRAM), a low power double data rate fourth generation (LPDDR4) SDRAM, a graphics double data rate (DDDR) SDRAM, a Low Power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (S I-RAM). In the present specification, for convenience of description, a description will be made on the assumption that the memory device 100 is a NAND flash memory.

In an embodiment, the memory device 100 may be implemented as a two-dimensional or a three-dimensional (3D) array structure. The present invention may be applied to a flash memory device in which a charge storage layer is formed of a conductive floating gate (FG), as well as be applied to a charge trap flash (CTF) memory device in which a charge storage layer is formed of an insulating layer.

In an embodiment, each of the memory cells included in the memory device 100 may be implemented as a single-level cell (SLC) in which one data bit is stored. Alternatively, each of the memory cells included in the memory device 100 may be implemented as a multi-level cell (MLC) in which two data bits are stored, a triple-level cell (TLC) in which three data bits are stored, or a quad-level cell (QLC) in which four data bits are stored.

The memory device 100 may receive a command and an address from the memory controller 200, and may access the area of the memory cell array, selected by the address. That is, the memory device 100 performs an operation corresponding to the command on the area selected by the address. For example, the memory device 100 may perform a write operation (i.e., program operation), a read operation, and an erase operation. During a program operation, the memory device 100 may program data to the area selected by the address, During a read operation, the memory device 100 may read data from the area selected by the address. During an erase operation, the memory device 100 may erase data stored in the area selected by the address.

The memory controller 200 may control the overall operation of the storage device 50.

When power is applied to the storage device 50, the memory controller 200 may execute firmware (FW). When the memory device 100 is a flash memory device, the memory controller 200 may execute firmware such as a Flash Translation Layer (FTL) for controlling communication between the host 400 and the memory device 100.

In an embodiment, the memory controller 200 may receive data and a logical block address (LBA) from the host 400, and may translate the logical block address into a physical block address (PBA) indicating the address of memory cells which are included in the memory device 100 and in which data is to be stored. Further, the memory controller 200 may store a logical-physical address mapping table, which configures mapping relationships between logical block addresses (LBA) and physical block addresses (PBA), in the buffer memory 300.

The memory controller 200 may control the memory device 100 to perform a program operation, a read operation, or an erase operation in response to a request received from the host 400. During a program operation, the memory controller 200 may provide a program command, a physical block address (PBA), and data to the memory device 100. During a read operation, the memory controller 200 may provide a read command and a physical block address (PBA) to the memory device 100. During an erase operation, the memory controller 200 may provide an erase command and a physical block address (PBA) to the memory device 100.

In an embodiment, the memory controller 200 may autonomously generate a program command, an address, and data without receiving a request from the host 400, and may provide the generated command, address, and data to the memory device 100. For example, the memory controller 200 may provide commands, addresses, and data to the memory device 100 to perform background operations such as a wear leveling operation and a garbage collection operation.

In an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store data, input from the host 400, in the buffer memory 300, and thereafter transmit the data, temporarily stored in the buffer memory 300, to the memory device 100.

In various embodiments, the buffer memory 300 may be used as a working memory or a cache memory of the memory controller 200. The buffer memory 300 may store codes and commands that are executed by the memory controller 200. Alternatively, the buffer memory 300 may store data that is processed by the memory controller 200.

By way of example and not limitation, in an embodiment, the buffer memory 300 may be implemented as a dynamic random access memory (DRAM) such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, or a Rambus DRAM (RDRAM), or as a static random access memory (SRAM).

Although FIG. 1 of the present disclosure shows that the buffer memory 300 is included in the storage device 50, the present invention is not limited thereto. For example, in various embodiments, the storage device 50 may not include the buffer memory 300. If the storage device 50 does not include the buffer memory 300, volatile memory devices provided external to the storage device 50 may function as the buffer memory 300.

In an embodiment, the memory controller 200 may control at least two memory devices 100. In this case, the memory controller 200 may control the memory devices 100 in an interleaving manner to improve operating performance.

The host 400 may communicate with the storage device 50 using at least one of various communication methods such as, for example, Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe of PCI-e), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The storage device 50 may be implemented as any one of various types of storage devices depending on a host interface that is a communication scheme with the host 400. By way of example and not limitation, the storage device 50 may be implemented as any one of various types of storage devices such as a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-e or PCIe) card-type storage device, a compact flash (CF) card, a smart media card, and a memory stick.

The storage device 50 may be manufactured in any one of various types of package forms. By way of example and not limitation, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

Figure 2:
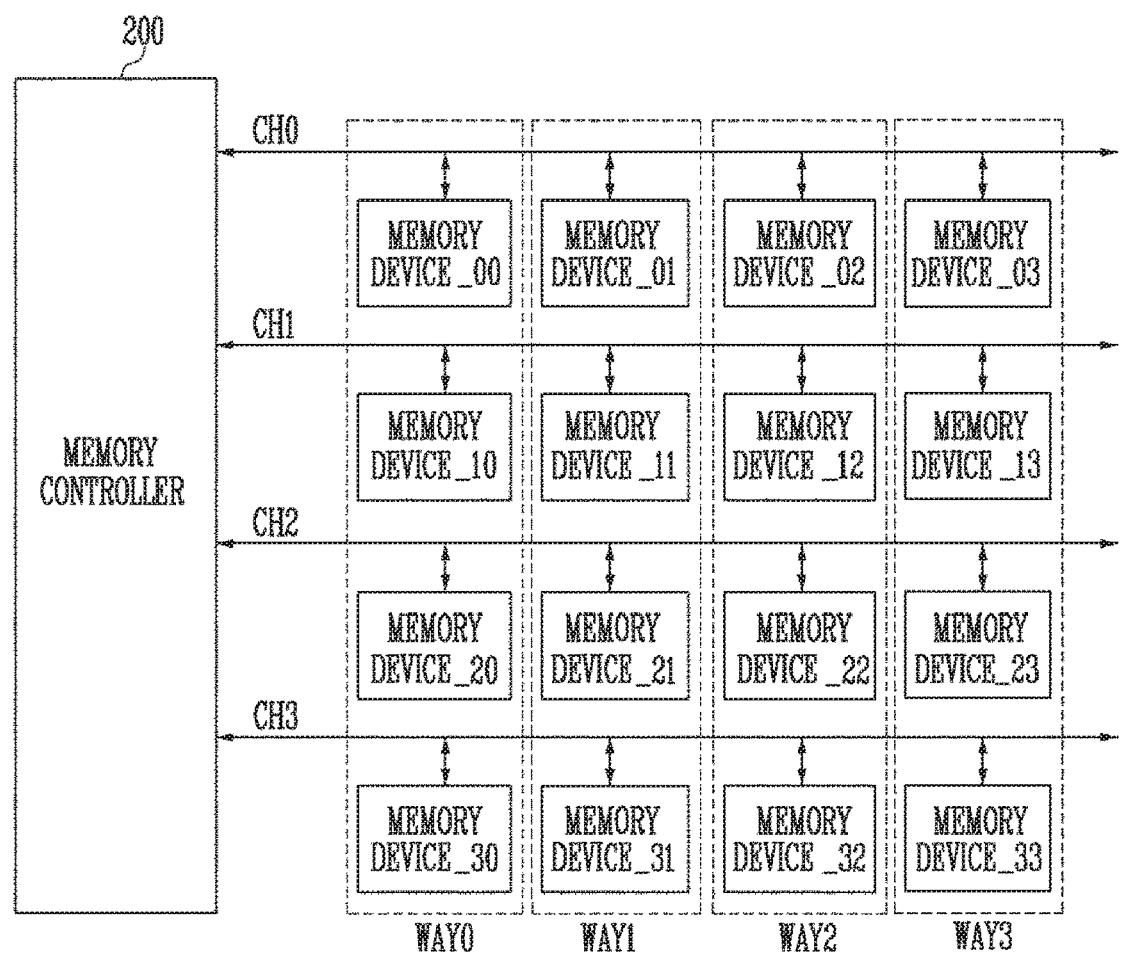
FIG. 2 is a block diagram illustrating an example of coupling relationships between a memory controller of FIG. 1 and a plurality of memory devices.

FIG. 2 is a block diagram illustrating coupling relationships between the memory controller, for example the memory controller 200 of FIG. 1, and a plurality of memory devices.

Referring to FIG. 2, the memory controller 200 may be coupled to a plurality of memory devices (e.g., memory device_00 to memory device_33) through a plurality of channels CH0 to CH3. In an embodiment, it should be understood that the number of channels or the number of memory devices coupled to each channel may be vary depending on design. However, for convenience of description, it is assumed in the present specification that the memory controller 200 is coupled to the memory devices through four channels, and four memory devices are coupled to each channel.

Memory device_00, memory device_01, memory device_02, and memory device_03 may be coupled in common to channel 0 CH0. The memory device_00, the memory device_01, the memory device_02, and the memory device_03 may communicate with the memory controller 200 through the channel 0 CH0. Since the memory device_00, the memory device_01, the memory device_02, and the memory device_03 are coupled in common to the channel 0 CH0, only a single memory device may communicate with the memory controller 200 at one time. However, the memory device_00, the memory device_01, the memory device_02, and the memory device_03 may simultaneously perform their own internal operations.

Memory device_10, memory device_11, memory device_12, and memory device_13 may be coupled in common to channel 1 CH1. The memory device_10, the memory device_11, the memory device_12, and the memory device_13 may communicate with the memory controller 200 through the channel 1 CH1. Since the memory device_10, the memory device_11, the memory device_12, and the memory device_13 are coupled in common to the channel 1 CH1, only a single memory device may communicate with the memory controller 200 at one time. However, the memory device 10, the memory device_1, the memory device_12, and the memory device_13 may simultaneously perform their own internal operations.

Memory device_20, memory device_21, memory device_22, and memory device_23 may be coupled in common to channel 2 CH2. The memory device_20, the memory device_21, the memory device_22, and the memory device_23 may communicate with the memory controller 200 through the channel 2 CH2. Since the memory device_20, the memory device_21, the memory device_22, and the memory device_23 are coupled in common to the channel 2 CH2, only a single memory device may communicate with the memory controller 200 at one time. However, the memory device_20, the memory device_21, the memory device_22, and the memory device_23 may simultaneously perform their own internal operations.

Memory device_30, memory device_31, memory device_3 and memory device_33 may be coupled in common to channel 3 CH3. The memory device_30, the memory device_31, the memory device_32, and the memory device_33 may communicate with the memory controller 200 through the channel 3 CH3. Since the memory device_30, the memory device_31, the memory device_32, and the memory device_33 are coupled in common to the channel 3 CH3, only a single memory device may communicate with the memory controller 200 at one time. However, the memory device_30, the memory device_31, the memory device_32, and the memory device_33 may simultaneously perform their own internal operations.

The storage device which uses a plurality of memory devices, for example memory device_00 to memory device_33, may improve performance by using data interleaving, which is data communication using an interleaving scheme. Data interleaving may be configured to perform a data read or write operation while shifting to ways (e.g., WAY0 to WAY3) in a structure in which two or more ways share a single channel with each other. For data interleaving, the memory devices may be managed on a way basis together with channels. In order to maximize parallelism of memory devices coupled to each channel, the memory controller 200 may distribute and allocate consecutive logical memory areas to channels and ways.

For example, the memory controller 200 may transmit commands, control signals including addresses, and data to the memory device_00 through the channel 0 CH0. While the memory device_00 is programming the received data to memory cells included therein, the memory controller 200 may perform the operation of transmitting commands, control signals including addresses, and data to the memory device_01.

In FIG. 2, the plurality of memory devices may be configured using four ways WAY) to WAY3. The first way WAY0 may include the memory device_00, the memory device_10, the memory device_20, and the memory device_30. The second way WAY1 may include the memory device_01, the memory device_11, the memory device_21, and the memory device_31. The third way WAY2 may include the memory device_02, the memory device_12, the memory device_22, and the memory device_32. The fourth way WAY3 may include the memory device_03, the memory device_13, the memory device_23, and the memory device_33.

Each of the channels CH0 to CH3 may be a bus for signals, which is shared and used by memory devices coupled to the corresponding channel.

Although, in FIG. 2, data interleaving in a 4-channel/4-way structure is illustrated, interleaving may be more efficient as the number of channels increases and the number of ways increases.

Figure 3A:
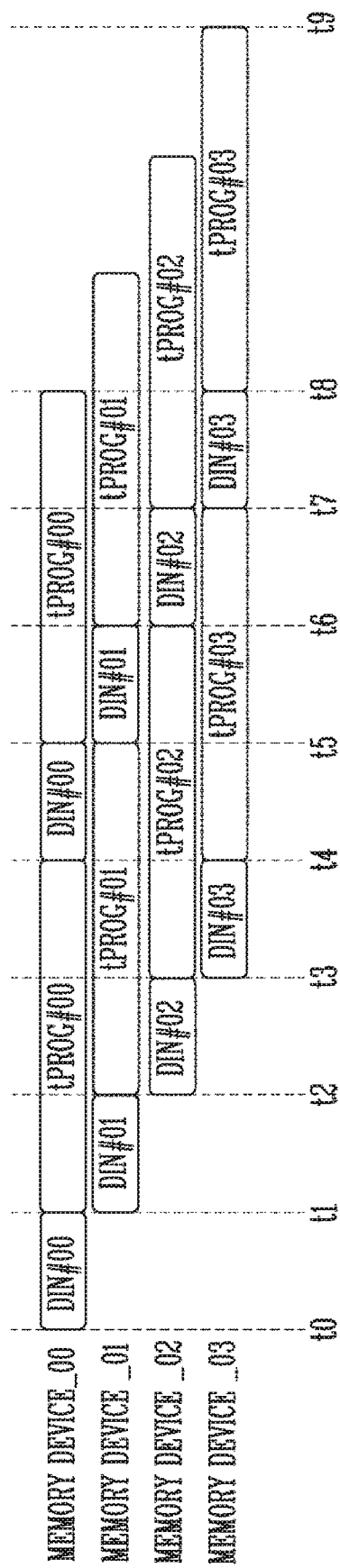
FIGS. 3A and 3B are timing diagrams explaining a program operation and a read operation depending on data interleaving.
Figure 3B:
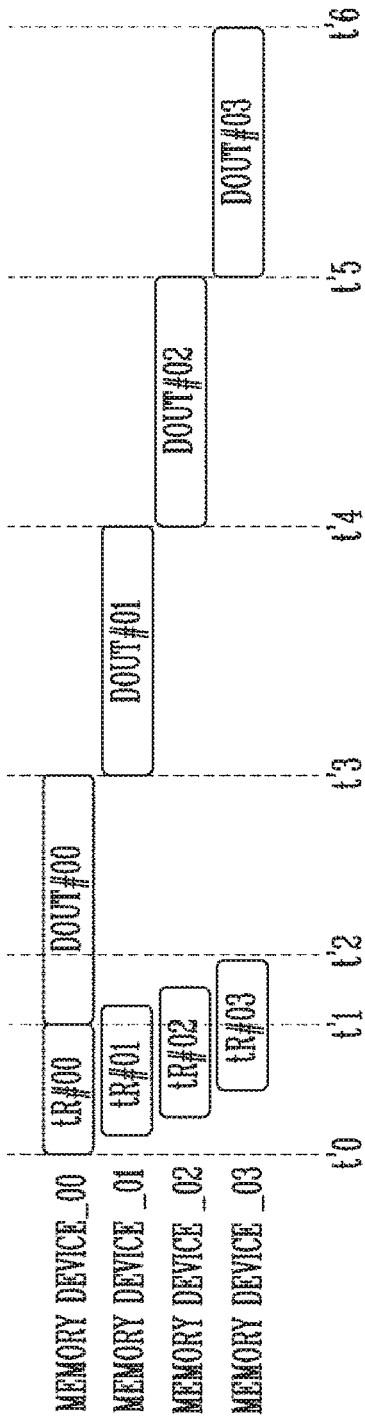

FIGS. 3A and 3B are timing diagrams explaining a program operation and a read operation depending on data interleaving. Specifically, FIG. 3A is a diagram explaining a program operation, and FIG. 3B is a diagram explaining a read operation. In FIGS. 3A and 3B, for convenience of description, it is assumed that program operation shown in FIG. 3A and read operation shown in FIG. 3B are performed on the memory device_00 to the memory device_03 coupled in common to the channel 0 CH0 of FIG. 2.

Referring to FIG. 3A, during a period from t0 to t1, data input DIN#00 may be performed on the memory device_00. The memory device_00 may receive a program command, an address, and data through channel 0 CH0 while the data input DIN#00 is being performed. Since the memory device_00, the memory device_01, the memory device _02, and the memory device_03 are coupled in common to the channel 0 CH0, remaining memory devices, that is, the memory device_01, the memory device_02, and the memory device_03, cannot use the channel 0 CH0 while the data input DIN#00 is being performed on the memory device_00.

During a period from t1 to t2, data input DIN#01 may be performed on the memory device_01. The memory device_01 may receive a program command, an address, and data through the channel 0 CH0 while the data input DIN#01 is being performed. Since the memory device_00, the memory device_01, the memory device_02, and the memory device_03 are coupled in common to the channel 0 CH0, remaining memory devices, that is, the memory device_00, the memory device _02, and the memory device _03, cannot use the channel 0 CH0 while the data input DIN#01 is being performed on the memory device_01. However, since the memory device_00 receives data (data input DIN#00) during the period from t0 to t1, a program operation tPROG#00 may be performed on the memory device_00 from time t1.

During a period from t2 to t3, data input DIN#02 may be performed on memory device_02. The memory device_02 may receive a program command, an address, and data through the channel 0 CH0 while the data input DIN#02 is being performed. Since the memory device_00, the memory device_01, the memory device_02, and the memory device_03 are coupled in common to the channel 0 CH0, remaining memory devices, that is, the memory device_00, the memory device_01, and the memory device _03, cannot use the channel 0 CH0 while the data input DIN#02 is being performed on the memory device_02. However, since the memory device_00 receives data (data input DIN#00) during the period from t0 to t1, the program operation tPROG#00 may be performed on the memory device_00 from time t1. Further, since the memory device_01 receives data (data input DIN#01) during the period from t1 to t2, a program operation tPROG#01 may be performed on the memory device_01 from time t2.

During a period from t3 to t4, data input DIN#03 may be performed on the memory device_03. The memory device_03 may receive a program command, an address, and data through the channel 0 CH0 while the data input DIN#03 is being performed. Since the memory device _00, the memory device_01, the memory device_02, and the memory device_03 are coupled in common to the channel 0 CH0, remaining memory devices, that is, the memory device_00, the memory device_01, and the memory device_02, cannot use the channel 0 CH0 while the data input DIN#03 is being performed on the memory device_01. However, since the memory device_00 receives data (data input DIN#00) during the period from t0 to t1, the program operation tPROG#00 may be performed on the memory device_00 from time t1. Further, since the memory device_01 receives data (data input DIN#01) during the period from t1 to t2, the program operation tPROG#01 may be performed on the memory device_01 from time t2. Furthermore, since the memory device_02 receives data (data input DIN#02) during the period from t2 to t3, a program operation tPROG#02 may be performed on the memory device_02 from time t3.

At time t4, the program operation tPROG#00 performed on the memory device_00 may be completed.

Thereafter, during a period from t4 to t8, data inputs DIN#00, DIN#01, DIN#02, and DIN#03 may be performed on the memory device_00 to the memory device_03 in the same way as was performed on the memory device_00 to the memory device_03 during the period from t0 to t4.

Referring to FIG. 3B, during a period from t'0 to t'2, the memory device_00 to the memory device_03 may read pieces of data (denoted as tR#00, tR#01, tR#02, and tR#03) internally corresponding to specific addresses. In an embodiment, the memory device_00 to the memory device_03 may read data on a page basis. The memory device_00 may read data during a period from t'0 to t'1 (denoted as tR#00), and may output the read data (denoted as DOUT#00) to the memory controller through the channel 0 CH0 during a period from t'1 to t'3.

During the period from t'1 to t'3, the memory device_00 outputs the data through the channel 0 CH0 (DOUT#00), and thus the memory device_01, the memory device_02, and the memory device_03 cannot use the channel 0 CH0.

During a period from t'3 to t'4, the memory device_01 may output the read data (denoted as DOUT#01) to the memory controller through the channel 0 CH0. During the period from t'3 to t'4, the memory device_01 outputs the data (DOUT#01) through the channel 0 CH0, and thus the memory device_00, the memory device_02, and the memory device_03 cannot use the channel 0 CH0.

During a period from t'4 to t'5, the memory device_02 may output the read data (denoted as DOUT#02) to the memory controller through the channel 0 CH0. During the period from t'4 to t'5, the memory device_02 outputs the data (DOUT#02) through the channel 0 CH0, and thus the memory device_00, the memory device_01, and the memory device_03 cannot use the channel 0 CH0.

During a period from t'5 to t'6, the memory device_03 may output the read data (denoted as DOUT#03) to the memory controller through the channel 0 CH0. During period from t'5 to t'6, the memory device_03 outputs the data (DOUT#03) through the channel 0 CH0, and thus the memory device_00, the memory device_01, and the memory device_02 cannot use the channel 0 CH0.

FIG. 4 is a diagram illustrating an example in which the configuration of a memory controller, for example the memory controller 200 of FIG. 1, is functionally divided.

Referring to FIG. 4, the memory controller 200 may include a flash translator 201, a host controller 202, and a flash controller 203. In FIG. 4, a case where the memory controller 200 controls a flash memory device will be described by way of example. That is, the memory device 100, described above with reference to FIG. 1, may be a flash memory device.

The memory controller 200 may be functionally divided into three layers. In detail, the memory controller 200 may be divided into a host interface layer (hereinafter referred to as an "HIL") for managing an interface with a host, a flash interface layer (hereinafter referred to as an "FIL") for managing an interface with the flash memory device, and a flash translation layer (hereinafter referred to as an "FTL") for managing translation between the two layers.

The memory controller 200 may execute firmware (FW) for controlling the operation of the memory device 100. In an embodiment, the firmware (FW) executed by the memory device may be divided into pieces of firmware respectively corresponding to HIL, FTL, and FIL, which may be used interchangeably with terms designating those pieces of firmware.

HIL may be implemented as the host controller 202. The host controller 202 may communicate with the host. The host controller 202 may communicate with the host using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe or PCI-e), NonVolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods. The host controller 202 may provide requests received from the host to the flash translator 201. The host controller 202 may provide the results of executing the requests received from the host to the host. In an embodiment, the host controller 202 may be implemented using hardware.

FTL may be firmware which performs overall operations for controlling communication between the host and the flash memory device. FTL may be implemented as the flash translator 201.

The flash translator 201 may translate a logical address included in each request from the host (e.g., the host 400 of FIG. 1) into a physical address. In an embodiment, the physical address may be an address indicating a specific memory area included in the flash memory device.

In an embodiment, the flash translator 201 may control operations for wear leveling. For example, the flash translator 201 may manage wear levels of memory blocks included in flash memory devices. The memory cells of the flash memory devices may be aged due to program and erase operations performed on the memory blocks. The aged or worn-out memory cells may cause faults (e.g., physical faults). Therefore, the flash translator 201 may manage wear leveling so that erase-write cycles of respective memory blocks are equalized in order to prevent specific memory blocks of the flash memory devices from being worn out earlier than other memory blocks.

In an embodiment, the flash translator 201 may control operations for garbage collection. Garbage collection may be a background operation for collecting pieces of valid data, respectively included in a plurality of memory blocks, in a memory block having the same address so as to secure available free blocks.

FIL may be implemented as the flash controller 203. The flash controller 203 may communicate with each flash memory device. In an embodiment, the flash controller 203 may communicate with the flash memory device through a communication interface corresponding to any one of a NAND flash memory and a NOR flash memory. The flash controller 203 may provide commands corresponding to requests received from the flash translator 201 to the flash memory device. The flash controller 203 may receive the results of commands executed by the flash memory device. The flash controller 203 may be implemented using hardware.

Figure 5:
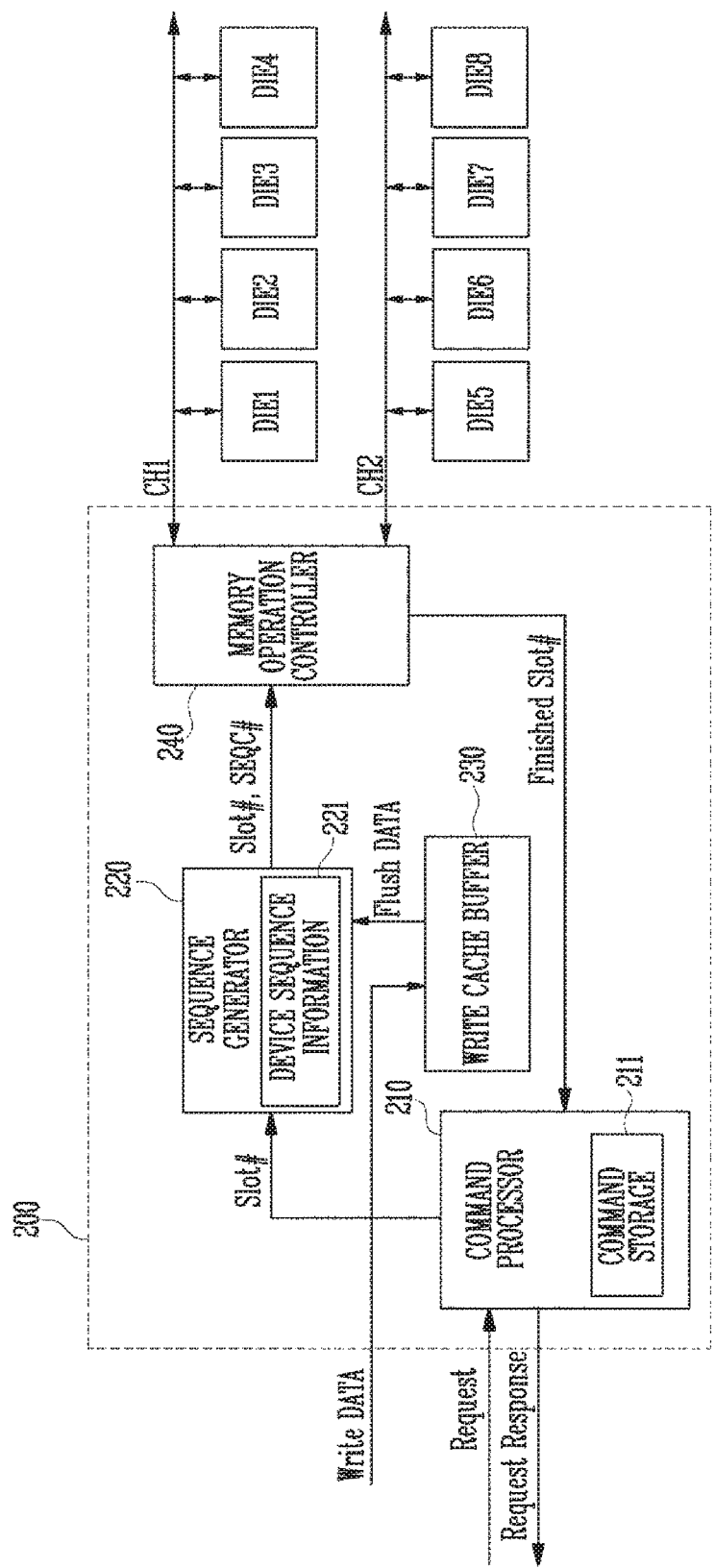
FIG. 5 is a block diagram illustrating the configuration of a memory controller according to an embodiment of the present disclosure.

FIG. 5 is a block diagram illustrating the configuration of a memory controller, for example the memory controller 200 of FIG. 1, according to an embodiment of the present disclosure.

Figure 6:
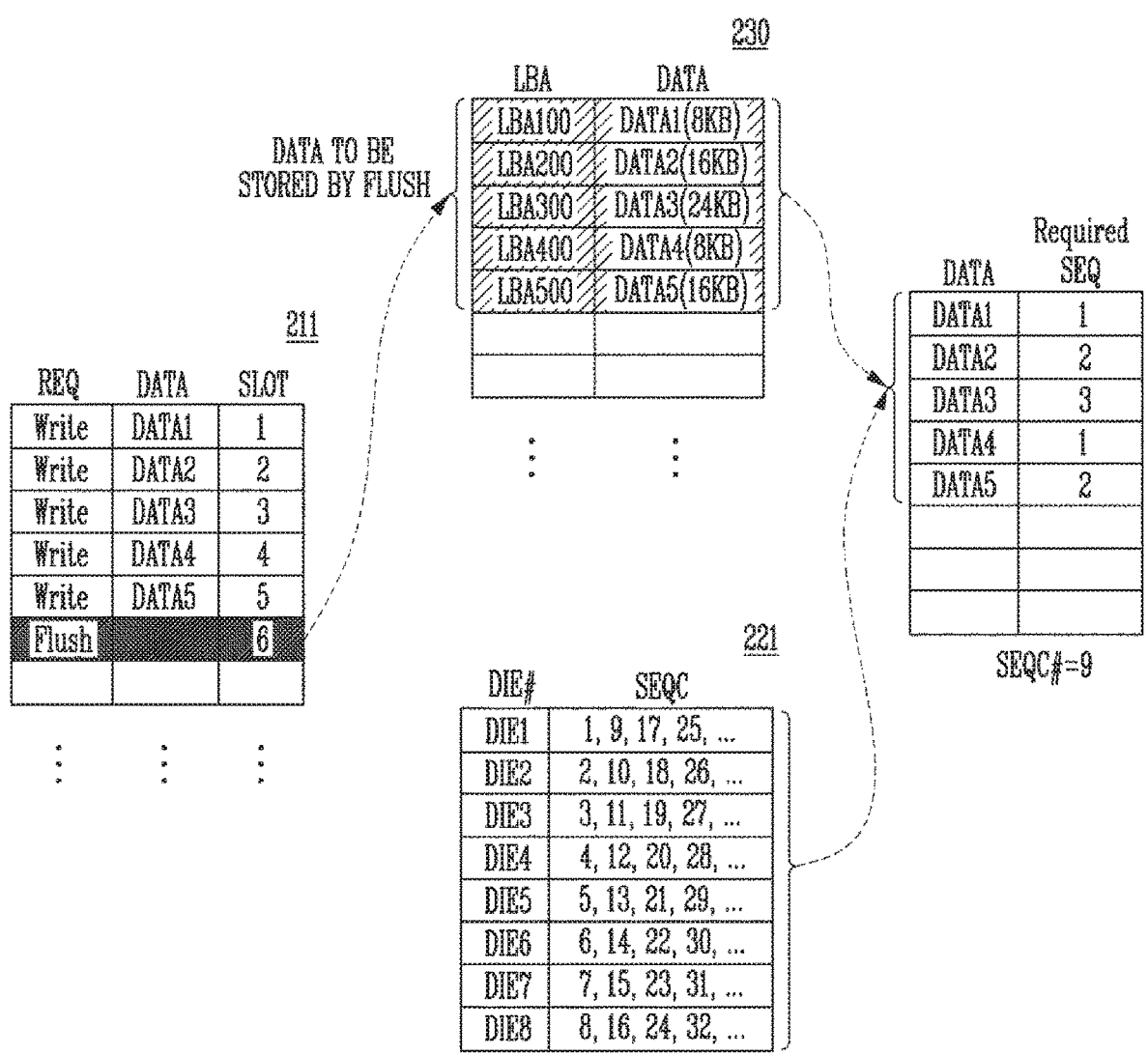
FIG. 6 is a diagram for explaining a method in which the memory controller of FIG. 5 processes a flush request.

FIG. 6 is a diagram for explaining a method in which the memory controller 200 of FIG. 5 processes a flush request.

Referring to FIGS. 5 and 6, the memory controller 200 may include a command processor 210, a sequence generator 220, a write cache buffer 230, and a memory operation controller 240.

The command processor 210 may receive requests from a host (e.g., the host 400 of FIG. 1) through the host controller 202 described above with reference to FIG. 4, and may generate commands corresponding to the received requests. The command processor 210 may assign slot numbers to the generated commands and may store the commands to which the slot numbers are assigned in a command storage 211 included therein.

When a request input from the host is a write request, the command processor 210 may store a write command and a slot number in the command storage 211.

The write cache buffer 230 may temporarily store write data, which is input together with the write request from the host. When a flush command is input from the command processor 210 to the sequence generator 220, the write data stored in the write cache buffer 230, may be stored in memory devices DIE1 to DIE8.

The command processor 210 may receive a flush request from the host. The flush request may be a request for commanding the data, which is temporarily stored in the write cache buffer 230, to be stored in the memory devices DIE1 to DIE8.

When the flush request is input, the command processor 210 may generate a flush command, assign a slot number to the flush command, and then store the flush command, to which the slot number is assigned, in the command storage 211.

In FIG. 6, it is assumed that the memory controller 200 is provided with write requests corresponding to slot number 1 to slot number 5 from the host, after which a flush request is input from the host. The command processor 210 may assign slot number 6 to the flush command, and may then store the flush command to which the slot number 6 is assigned in the command storage 211.

The write cache buffer 230 may store pieces of write data, which respectively correspond to the write requests of assigned slot number 1 to slot number 5, with the logical block addresses assigned. For example, write data corresponding to the write request for slot number 1 is DATA1 and has a size of 8 KB. For example, write data corresponding to the write request for slot number 2 is DATA2 and has a size of 16 KB. For example, write data corresponding to the write request for slot number 3 is DATA3 and has a size of 24 KB. For example, write data corresponding to the write request for slot number 4 is DATA4 and has a size of 8 KB. For example, write data corresponding to the write request for slot number 5 is DATA5 and has a size of 16 KB.

The command processor 210 may provide the slot number (e.g., slot number 6) of the flush command to the sequence generator 220.

The sequence generator 220 may determine flush data, which is data to be stored in the memory devices DIE1 to DIES in response to the flush command, among pieces of write data stored in the write cache buffer 230.

The flush command having slot number 6 may be a command for instructing pieces of write data, corresponding to the write commands having slot number 1 to slot number 5, to be stored in the memory devices. Therefore, pieces of data corresponding to the write commands having slot number 1 to slot number 5, among the pieces of data stored in the write cache buffer 230, may be determined to be flush data.

In FIG. 5, for convenience of description, it is assumed that the memory controller 200 controls memory devices corresponding to first to eighth dies DIE1 to DIE8. The first to fourth dies DIE1 to DIE4 are coupled in common to channel 1 CH1, and the fifth to eighth dies DIE5 to DIE8 are coupled in common to channel 2 CH2.

The sequence generator 220 may generate a write sequence, in which the flush data is to be stored in the memory devices, based on device sequence information 221 stored therein. For example, the sequence generator 220 may generate, based on the device sequence information 221, a write sequence in which the flush data is to be stored in the memory devices. The device sequence information 221 may include a sequence SECQ of memory devices DIE1 to DIE8 to store the flush data. The memory controller 200 may select the memory devices DIE1 to DIE8 according to the device sequence and control the selected memory device to perform a write operation with the flush data.

The sequence generator 220 may generate a write sequence in which the flush data is to be stored in the first to eighth dies DIE1 to DIE8. The sequence generator 220 may determine a last device sequence SEQC# indicating a memory device in which the flush data is to be stored last depending on the write sequence, based on the size of the flush data and the device sequence of the memory devices.

Referring back to FIG. 6, the flush data may have a data size of 72 KB. It is assumed that a program unit by which data is stored in a single memory device is a page, and that one page has a size of 8 KB. Then, the flush data may be stored in a total of nine pages in the respective memory devices DIE1 to DIE8, and the last device sequence SEQC# indicating a memory device in which the flush data is to be stored last is 9 when assuming the flush data is to be stored first in the first memory devices DIE1, which is the first in the device sequence. In a case where the flush data is to be stored first in a memory device other than the first memory device DIE1 due to the write sequence, the last device sequence SEQC# may also be changed with reference to the memory device in which the flush data is to be stored first. For example, when the flush data is to be stored first in the fifth memory device DIE5 due to the write sequence, the last device sequence SEQC# may be 13 and thus the fifth memory device DIE5 may also be the one to store the flush data last.

That is, a size of the device sequence ("Required SEQ" in FIG. 6) for processing pieces of the flush data corresponding to the respective write commands may be determined, and the last device sequence SEQC# (e.g., 9) for the flush command may be a value obtained by summing up the size of the device sequence for the respective write commands having slot number 1 to slot number 5 corresponding to the pieces of the flush data. The last device sequence SEQC# is 9, and thus it can be seen that the memory device which stores data last is die #1 DIE1 depending on the device sequence information 221 when assuming the flush data is to be stored first in the first memory devices DIE1, which is the first in the device sequence. For example, when the flush data is to be stored first in the fifth memory device DIE5, the last device sequence SEQC# may be 13.

The sequence generator 220 may provide the last device sequence SEQC# and the slot number Slot# of the flush command to the memory operation controller 240.

The memory operation controller 240 may sequentially store the pieces of the flush data in the memory devices DIE1 to DIE 8 until a write operation is performed on a memory device corresponding to the last device sequence SEQC# according to the write sequence.

When the write operation is performed on the memory device corresponding to the last device sequence SEQC#, the memory operation controller 240 may provide the command processor 210 with the slot number of the flush command, for which the write operation has been completed, as a response to the flush command.

The command processor 210 may provide the result of processing the flush request to the host according to the slot number of the flush command for which the operation has been completed.

While the sequence generator 220 and the memory operation controller 240 store the flush data in the memory devices DIE1 to DIE8 in response to the flush command, a write request may be input. Since a conventional memory controller performs a barrier operation of stopping the storage of data in the write cache buffer 230 while a flush command is being input, the deterioration of performance has occurred.

However, in accordance with an embodiment of the present disclosure, while the memory operation controller 240 stores flush data in the memory devices DIE1 to DIE8 using the device sequence in response to the flush command, the command processor 210 may continue to generate commands for subsequently input write requests, and may store the generated commands in the command storage 211. Further, since flush data that is data to be processed in response to the flush command has already been determined according to the slot numbers of the flush command and the write commands previous to the flush command, write data to be subsequently input may also be stored in the write cache buffer 230.

In FIG. 5, the memory operation controller 240 may be included in the flash controller 203, described above with reference to FIG. 4. In an embodiment, the command processor 210 and the sequence generator 220 may be included in the Flash Translation Layer (FTL) described above with reference to FIG. 4. Therefore, in accordance with the embodiment of the present disclosure, FTL may not be involved in write operations performed in response to the flush command, and thus the memory controller 200 may not perform the barrier operation of stopping the input of data to the write cache buffer in response to the input of the flush command.

Figure 7:
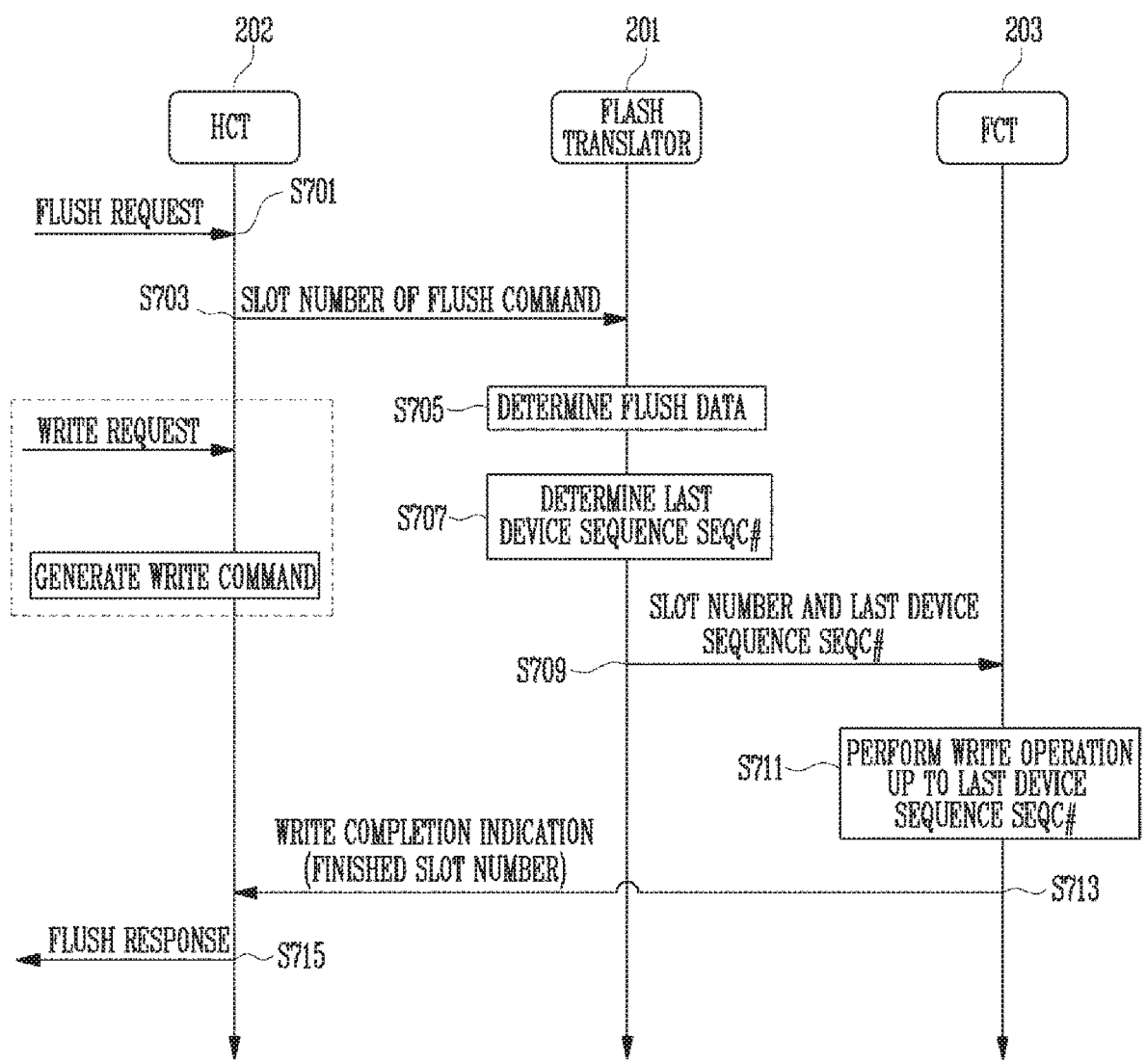
FIG. 7 is a flowchart illustrating a method of operating a memory controller according to an embodiment of the present disclosure.

FIG. 7 is a flowchart illustrating a method of operating a memory controller, for example the memory controller 200 of FIGS. 1, 4, and 5, according to an embodiment of the present disclosure. In describing the method of operating the memory controller 200, references will be made to FIGS. 1, 4, and 5.

Referring to FIG. 7, the host controller 202 (denoted as "HCT 202" in FIG. 7) may receive a flush request from an external host (e.g., the host 400 of FIG. 1) at step S701.

At step S703, the host controller 202 may generate a flush command in response to the flush request received from the external host, and may assign a slot number to the generated flush command.

The host controller 202 may transfer an indication that the flush command has been input to the flash translator 201.

At step S705, the flash translator 201 may determine flush data which is write data to be stored in the memory devices in response to the flush command, among pieces of write data stored in the write cache buffer.

At step S707, the flash translator 201 may assign device sequence to respective write requests, and may determine a last device sequence SEQC# set depending on the device sequence.

At step S709, the flash translator 201 may provide the slot number of the flush command and the last device sequence SEQC# to the flash controller 203 (denoted as "FCT 203" in FIG. 7).

At step S711, the flash controller 203 may control a plurality of memory devices so that the flush data is programmed to the plurality of memory devices depending on the slot number of the input flush command and the last device sequence SEQC#.

At step S713, the flash controller 203 may provide the host controller 202 with an indication that the program operation has been completed. The flash controller 203 may provide the host controller 202 with the finished slot number of the flush command.

At step S715, the host controller 202 may provide a flush response indicating that the execution of the flush request has been completed to the external host.

Figure 8:
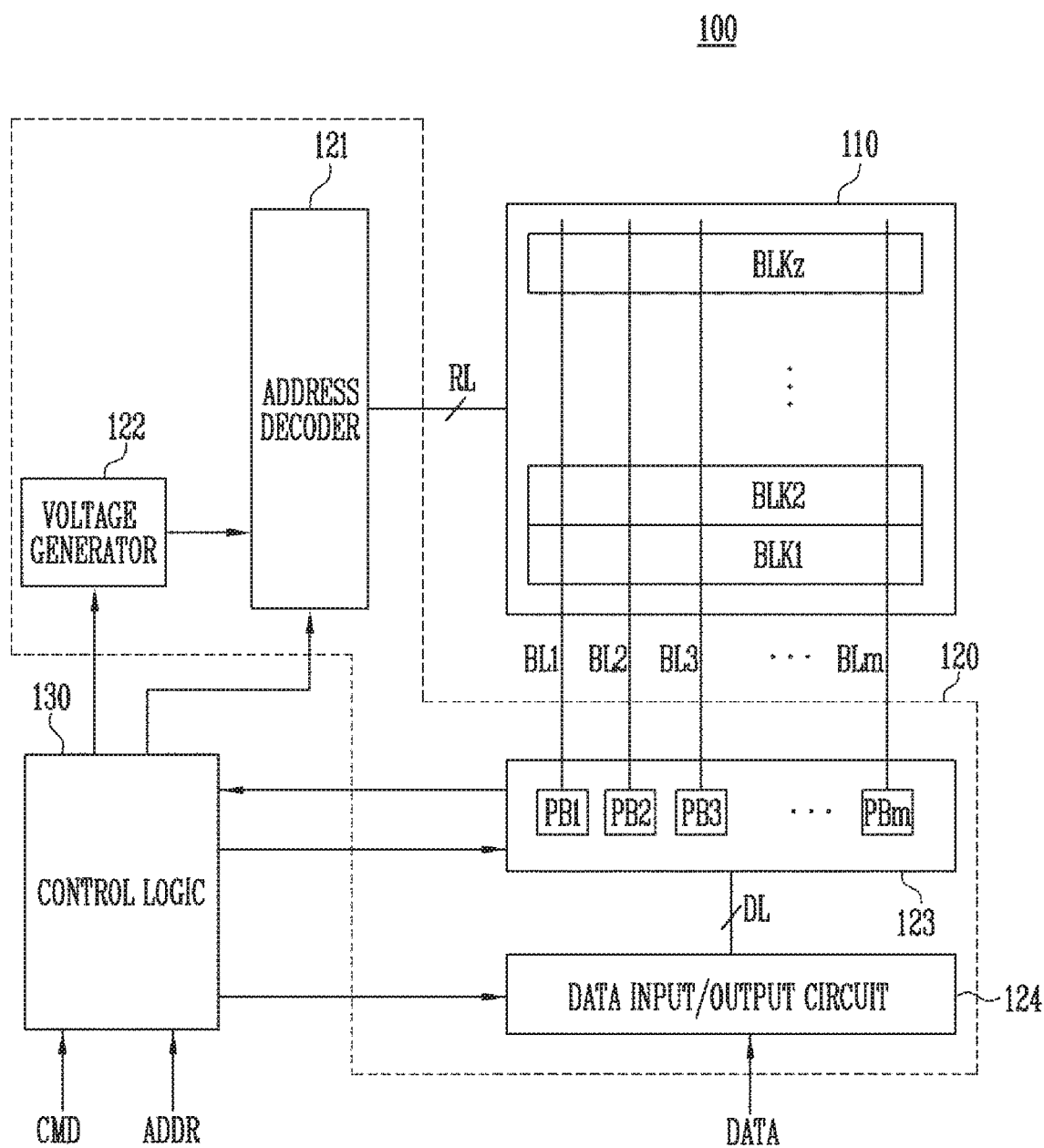
FIG. 8 is a diagram illustrating the structure of a memory device of FIG. 1.

FIG. 8 is a diagram illustrating the configuration of a memory device, for example the memory device 100 of FIG. 1.

Referring to FIG. 8, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The memory blocks BLK1 to BLKz are coupled to a read and write circuit 123 through bit lines BL1 to BLm. Each of the memory blocks BLK1 to BLKz includes a plurality of memory cells. In an embodiment, the plurality of memory cells are nonvolatile memory cells. In the plurality of memory cells, memory cells coupled to the same word line are defined as a single page. That is, the memory cell array 110 is composed of a plurality of pages. In an embodiment, each of the plurality of memory blocks BLK1 to BLKz included in the memory cell array 110 may include a plurality of dummy cells. As the dummy cells, one or more dummy cells may be coupled in series between a drain select transistor and the memory cells and between a source select transistor and the memory cells.

Each of the memory cells of the memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, the read and write circuit 123, and a data input/output circuit 124.

The peripheral circuit 120 may drive the memory cell array 110. For example, the peripheral circuit 120 may drive the memory cell array 110 so that a program operation, a read operation, and an erase operation are performed.

The address decoder 121 is coupled to the memory cell array 110 through row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 is configured to be operated under the control of the control logic 130. The address decoder 121 receives the address ADDR from the control logic 130.

The address decoder 121 configured to decode a block address of the received address ADDR. The address decoder 121 selects at least one memory block from among the memory blocks BLK1 to BLKz in response to the decoded block address. The address decoder 121 is configured to decode a row address of the received address ADDR. The address decoder 121 may select at least one word line of the selected memory block by applying voltages supplied from the voltage generator 122 to at least one word line WL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to a selected word line and apply a verification pass voltage higher than the verify voltage to unselected word lines.

During a read operation, the address decoder 121 may apply a read voltage to a selected word line and apply a pass voltage higher than the read voltage to unselected word In an embodiment, the erase operation of the memory device 100 may be performed on a memory block basis.

During an erase operation, the address ADDR inputted to the memory device 100 includes a block address. The address decoder 121 may decode the block address and select a single memory block in response to the decoded block address. During the erase operation, the address decoder 121 may apply a ground voltage to word lines coupled to the selected memory block.

In an embodiment, the address decoder 121 may be configured to decode a column address of the received address ADDR. A decoded column address (DCA) may be transferred to the read and write circuit 123. In an exemplary embodiment, the address decoder 121 may include components such as a row decoder, a column decoder, and an address buffer.

The voltage generator 122 is configured to generate a plurality of voltages using an external supply voltage provided to the memory device 100. The voltage generator 122 is operated under the control of the control logic 130.

In an embodiment, the voltage generator 122 may generate an internal supply voltage by regulating the external supply voltage. The internal supply voltage generated by the voltage generator 122 is used as an operating voltage of the memory device 100.

In an embodiment, the voltage generator 122 may generate a plurality of voltages using an external supply voltage or an internal supply voltage. The voltage generator 122 may be configured to generate various voltages required by the memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage, and may generate a plurality of voltages by selectively activating the pumping capacitors under the control of the control logic 130.

The generated voltages may be supplied to the memory cell array 110 by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm are operated under the control of the control logic 130.

The first to m-th page buffers PB1 to PBm perform data communication with the data input/output circuit 124. During a program operation, the first to m-th page buffers PB1 to PBm receive data to be stored DATA through the data input/output circuit 124 and data lines DL.

During a program operation, the first to m-th page buffers PB1 to PBm may transfer the data DATA, received through the data input/output circuit 124, to selected memory cells through the bit lines BL1 to BLm when a program pulse is applied to each selected word line. The memory cells in the selected page are programmed based on the transferred data DATA. Memory cells coupled to a bit line to which a program permission voltage (e.g., a ground voltage) is applied may have increased threshold voltages. Threshold voltages of memory cells coupled to a bit line to which a program prohibition voltage (e.g., a supply voltage) is applied may be maintained. During a program verify operation, the first to m-th page buffers may read page data from the selected memory cells through the bit lines BL1 to BLm.

During a read operation, the read and write circuit 123 may read data DATA from the memory cells in the selected page through the bit lines BL, and may output the read data DATA to the data input/output circuit 124.

During an erase operation, the read and write circuit 123 may allow the bit lines BL to float. In an embodiment, the read and write circuit 123 may include a column select circuit.

The data input/output circuit 124 is coupled to the first to m-th page buffers PB1 to PBm through the data lines DL. The data input/output circuit 124 is operated under the control of the control logic 130.

The data input/output circuit 124 may include a plurality of input/output buffers (not illustrated) for receiving input data. During a program operation, the data input/output circuit 124 receives data to be stored DATA from an external controller (not illustrated). During a read operation, the data input/output circuit 124 outputs the data, received from the first to m-th page buffers PB1 to PBm included in the read and write circuit 123, to the external controller.

The control logic 130 may be coupled to the address decoder 121, the voltage generator 122, the read and write circuit 123, and the data input/output circuit 124. The control logic 130 may control the overall operation of the memory device 100. The control logic 130 may be operated in response to a command CMD received from an external device.

Figure 9:
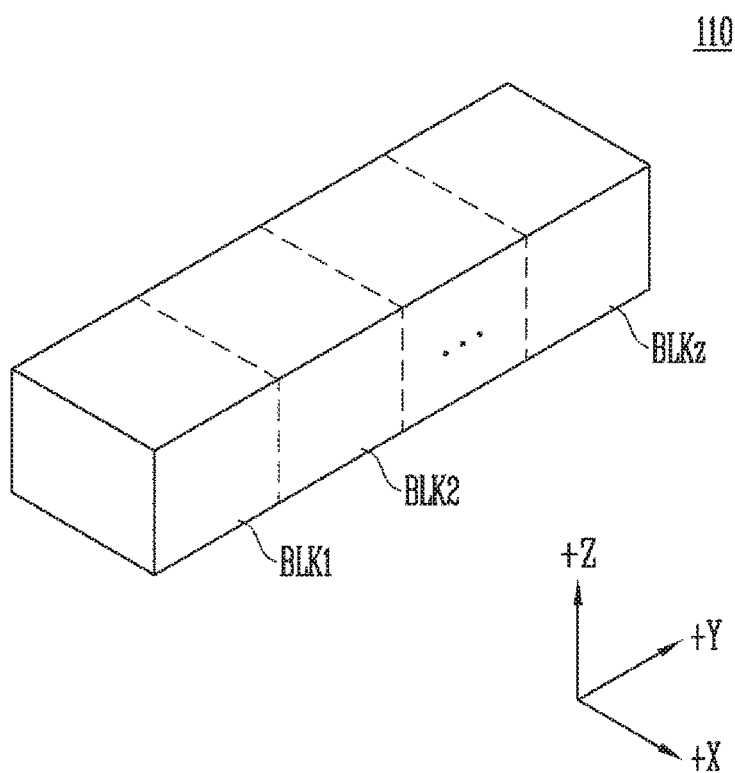
FIG. 9 is a diagram illustrating an embodiment of a memory cell array of FIG. 7.

FIG. 9 is a diagram illustrating an embodiment of the memory cell array 110 of FIG. 8.

Referring to FIG. 9, the memory cell array 110 includes a plurality of memory blocks BLK1 to BLKz. Each memory block may have a two-dimensional or a three-dimensional (3D) structure. In the embodiment described in FIG. 9, a three-dimensional structure is described. When the memory blocks have a 3D structure, each memory block includes a plurality of memory cells stacked on a substrate. Such memory cells are arranged along a positive X(+X) direction, a positive Y(+Y) direction, and a positive Z(+Z) direction. The structure of each memory block will be described in detail below with reference to FIGS. 10 and 11.

Figure 10:
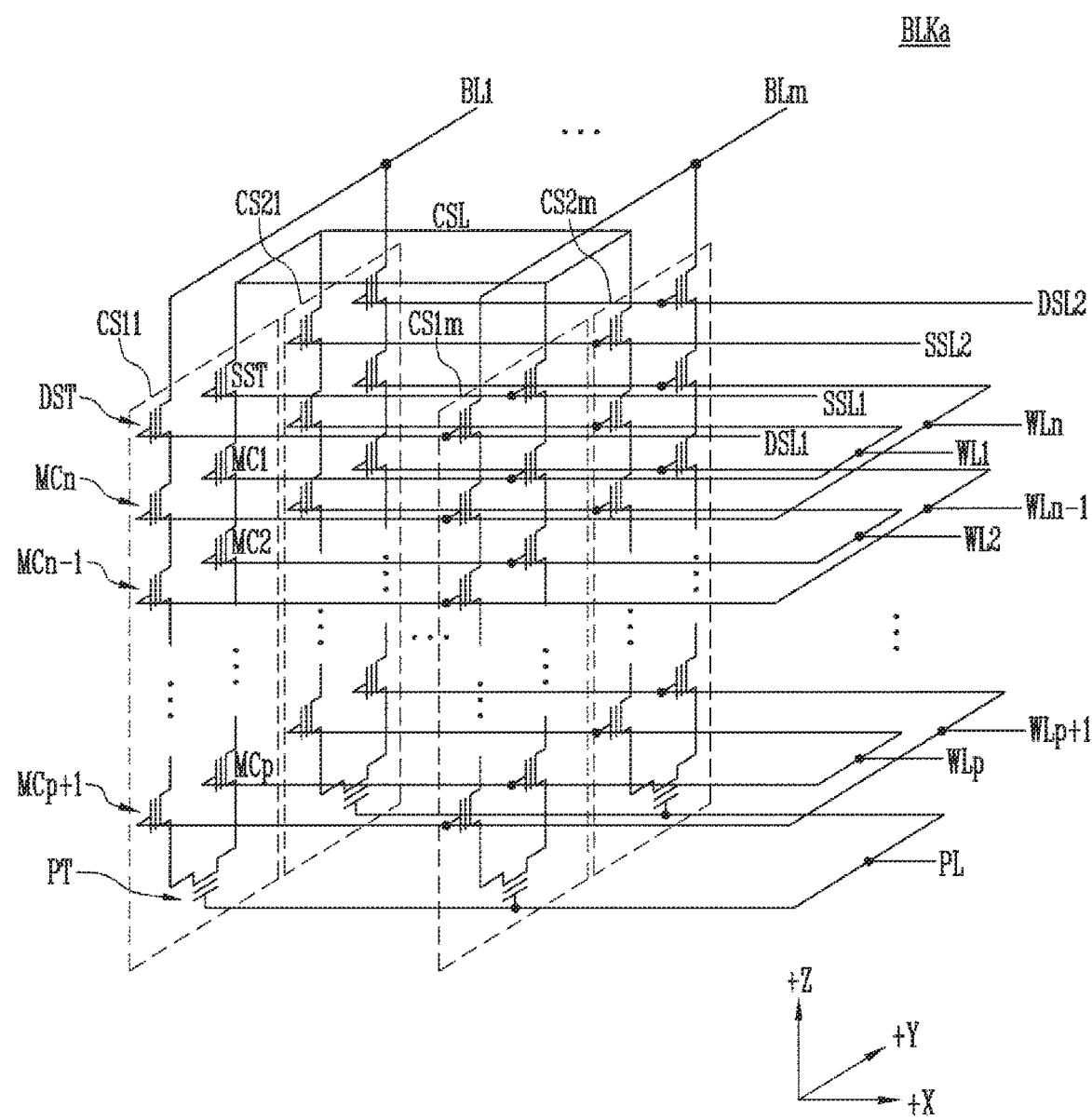
FIG. 10 is a circuit diagram illustrating any one memory block BLKa among memory blocks BLK1 to BLKz of FIG. 9.

FIG. 10 is a circuit diagram illustrating a memory block BLKa. The memory block BLKa may correspond to any one among the memory blocks BLK1 to BLKz of FIG. 9.

Referring to FIG. 10, the memory block BLKa includes a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings are arranged in a row direction (i.e. a positive (+)X direction). In FIG. 10, two cell strings are illustrated as being arranged in a column direction (i.e. a positive (+)Y direction). However, this illustration is made for convenience of description, and it will be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are coupled to a source select line extending in a row direction, and source select transistors of cell strings arranged in different rows are coupled to different source select lines. In FIG. 10, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to nth memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+)Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

A gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 10, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1, among the cell strings CS11 to CS1m in the first row, constitute a single page. Memory cells coupled to the first word line WL1, among the cell strings CS21 to CS2m in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, even bit lines and odd bit lines, instead of first to m-th bit lines BL1 to BLm, may be provided. Further, even-numbered cell strings, among the cell strings CS11 to CS1m or CS21 to CS2m arranged in a row direction, may be coupled to the even bit lines, respectively, and odd-numbered cell strings, among the cell strings CS11 to CS1m or CS21 to CS2m arranged in the row direction, may be coupled to the odd bit lines, respectively.

In an embodiment, one or more of the first to n-th memory cells MC1 to MCn may be used as dummy memory cells. For example, one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As more dummy memory cells are provided, the reliability of the operation of the memory block BLKa is improved, but the size of the memory block BLKa is increased. As fewer memory cells are provided, the size of the memory block BLKa is reduced, but the reliability of the operation of the memory block BLKa may be deteriorated.

In order to efficiently control the one or more dummy memory cells, each of the dummy memory cells may have a required threshold voltage. Before or after the erase operation of the memory block BLKa is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 11:
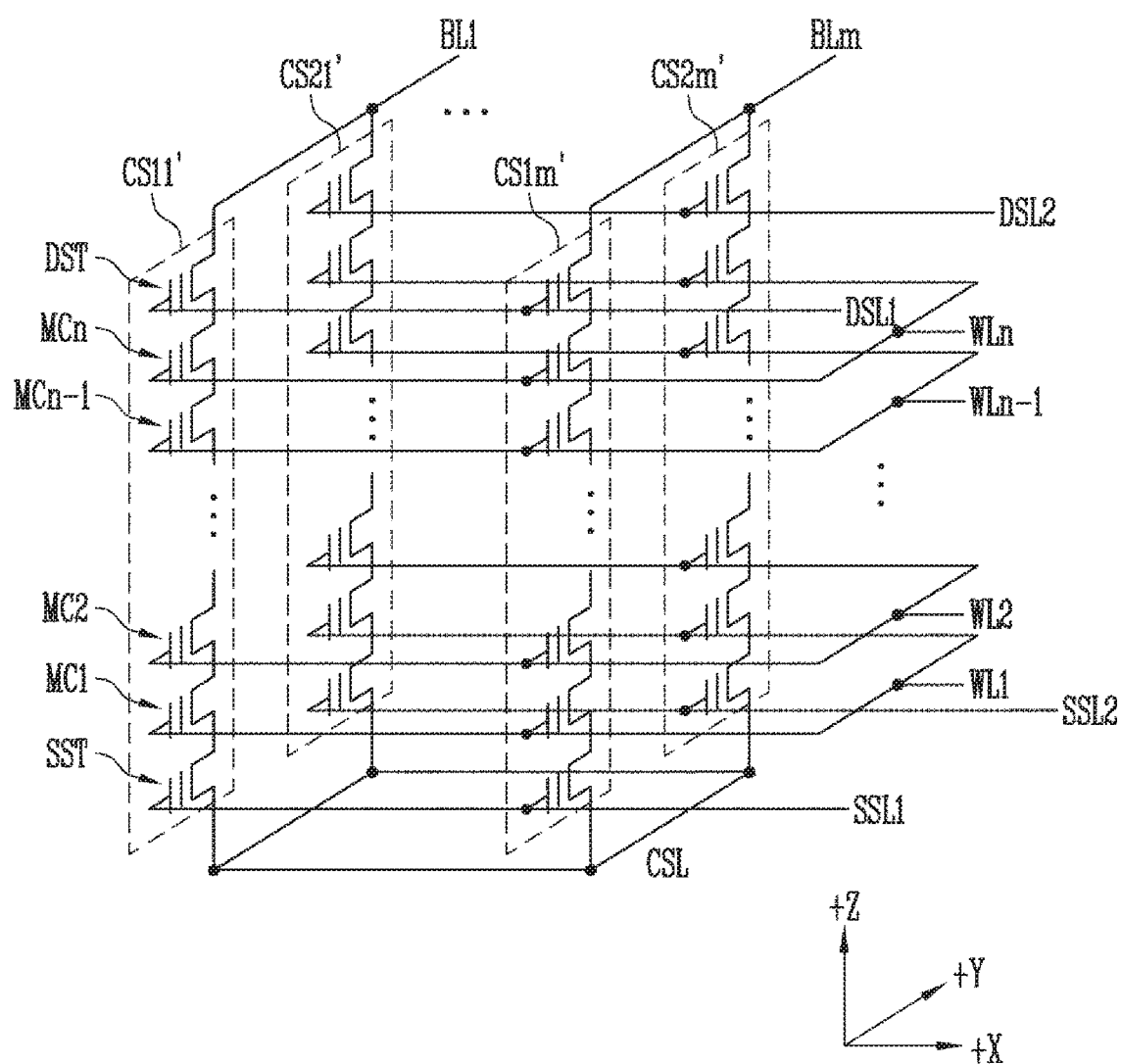
FIG. 11 is a circuit diagram illustrating an example of any one memory block BLKb among the memory blocks BLK1 to BLKz of FIG. 10.

FIG. 11 is a circuit diagram illustrating a memory block BLKb. The memory block BLKb may correspond to any one among the memory blocks BLK1 to BLKz of FIG. 9.

Referring to FIG. 11, the memory block BLKb includes a plurality of cell strings CS11' to CS1m' and CS21' to CS2m'. Each of the plurality of cell strings CS11' to CS1m' and CS21' to CS2m' extends along a positive Z(+Z) direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST of each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

As a result, the memory block BLKb of FIG. 11 has a circuit similar to that of the memory block BLKa of FIG. 10. That is, the pipe transistor PT is excluded from each cell string in the memory block BLKb of FIG. 11.

In an embodiment, even bit lines and odd bit lines, instead of first to m-th bit lines BL1 to BLm, may be provided. Further, even-numbered cell strings, among the cell strings CS11' to CS1m' or CS21' to CS2m' arranged in a row direction, may be coupled to the even bit lines, respectively, and odd-numbered cell strings, among the cell strings CS11' to CS1m' or CS21' to CS2m' arranged in the row direction, may be coupled to the odd bit lines, respectively.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As more dummy memory cells are provided, the reliability of the operation of the memory block BLKb is improved, but the size of the memory block BLKb is increased. As fewer memory cells are provided, the size of the memory block BLKb is reduced, but the reliability of the operation of the memory block BLKb may be deteriorated.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells control the voltages that are applied to the dummy word lines coupled to respective dummy memory cells, and thus the dummy memory cells may have required threshold voltages.

Figure 12:
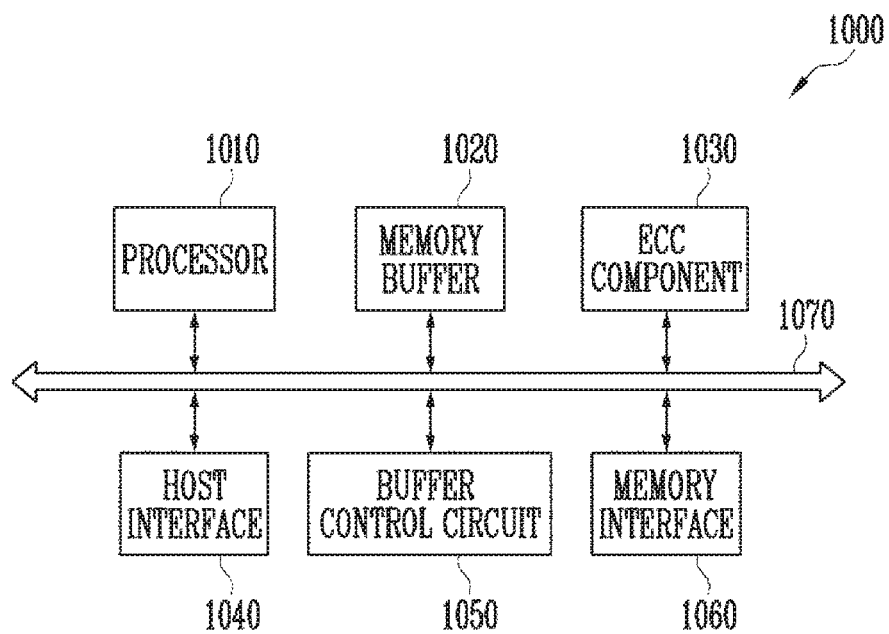
FIG. 12 is a diagram illustrating an embodiment of the memory controller of FIG. 1.

FIG. 12 is a diagram illustrating an embodiment of the memory controller 200 of FIG. 1.

A memory controller 1000 is coupled to a host and a memory device. In response to a request received from the host, the memory controller 1000 may access the memory device. For example, the memory controller 1000 may be configured to control write, read, erase, and background operations of the memory device. The memory controller 1000 may provide an interface between the memory device and the host. The memory controller 1000 may run firmware for controlling the memory device.

Referring to FIG. 12, the memory controller 1000 may include a processor 1010, a memory buffer 1020, an error checking and correction unit (ECC) component 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and may perform a logical operation. The processor 1010 may communicate with an external host through the host interface 1040 and also communicate with the memory device through the memory interface 1060. Further, the processor 1010 may communicate with the memory buffer 1020 through the buffer control circuit 1050. The processor 1010 may control the operation of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. Examples of an address mapping method performed through the FTL may include various methods according to a mapping unit. Representative address mapping methods include a page mapping method, a block mapping method, and a hybrid mapping method.

The processor 1010 may randomize data received from the host. For example, the processing unit 1010 may use a randomizing seed to randomize data received from the host. The randomized data may be provided, as data to be stored, to the memory device and may be programmed in the memory cell array.

The processor may derandomize data received from the memory device during a read operation. For example, the processor 1010 may derandomize the data received from the memory device using a derandomizing seed. The derandomized data may be outputted to the host.

In an embodiment, the processor 1010 may run software or firmware to perform randomizing and derandomizing operations. The memory buffer 1020 may be used as a working memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC component 1030 may perform error correction. The ECC component 1030 may perform error correction code (ECC) encoding based on data to be written to the memory device through the memory interface 1060. The ECC-encoded data may be transferred to the memory device through the memory interface 1060. The ECC component 1030 may perform ECC decoding based on data received from the memory device through the memory interface 1060. In an example, the ECC component 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods. In an embodiment, the host interface 1040 may be included in the host controller 202, described above with reference to FIG. 4.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels. In an embodiment, the memory interface 1060 may be included in the flash controller 203, described above with reference to FIG. 4.

In an embodiment, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In an embodiment, the processor 1010 may load codes from the memory device through the memory interface 1060.

In an embodiment, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with each other nor influence each other. The data bus may be coupled to the host interface 1040, the buffer control circuit 1050, the ECC component 1030, and the memory interface 1060. The control bus may be coupled to the host interface 1040, the processor 1010, the buffer control circuit 1050, the memory buffer 1020, and the memory interface 1060.

Figure 13:
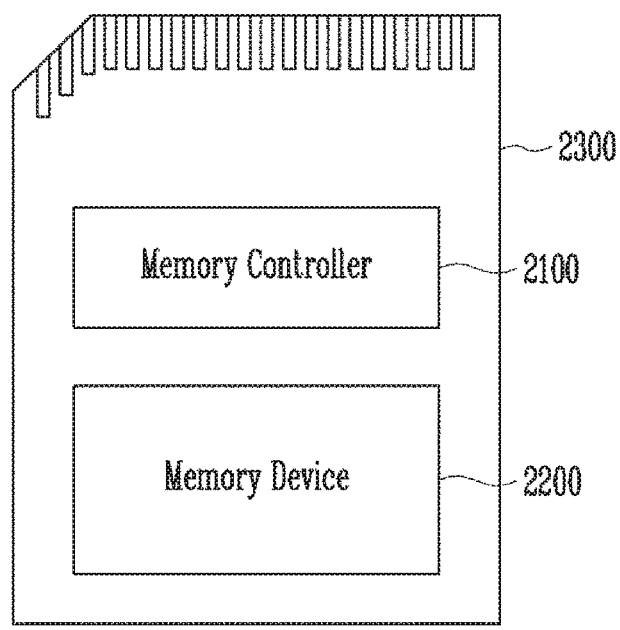
FIG. 13 is a block diagram illustrating a memory card system to which the storage device according to an embodiment of the present disclosure is applied.

FIG. 13 is a block diagram illustrating a memory card system to which the storage device according to an embodiment of the present disclosure is applied.

Referring to FIG. 13, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may be control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same way as the memory controller 200 described above with reference to FIG. 1.

In an embodiment, the memory controller 2100 may include components, such as a RAM, a processing unit, a host interface, a memory interface, and an ECC component.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (DATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card such as a PC card (personal computer memory card international association: PCMCIA), a compact flash card (CF), a smart media card (SM or SMC), a memory stick, a multimedia card (MMC, RS-MMC, MMC micro or eMMC), a SD card (SD, miniSD, microSD, or SDHC), or a universal flash storage (UFS), FIG. 14 is a block diagram illustrating an example of a solid state drive (SSD) system to which the storage device according to an embodiment of the present disclosure is applied.

Figure 14:
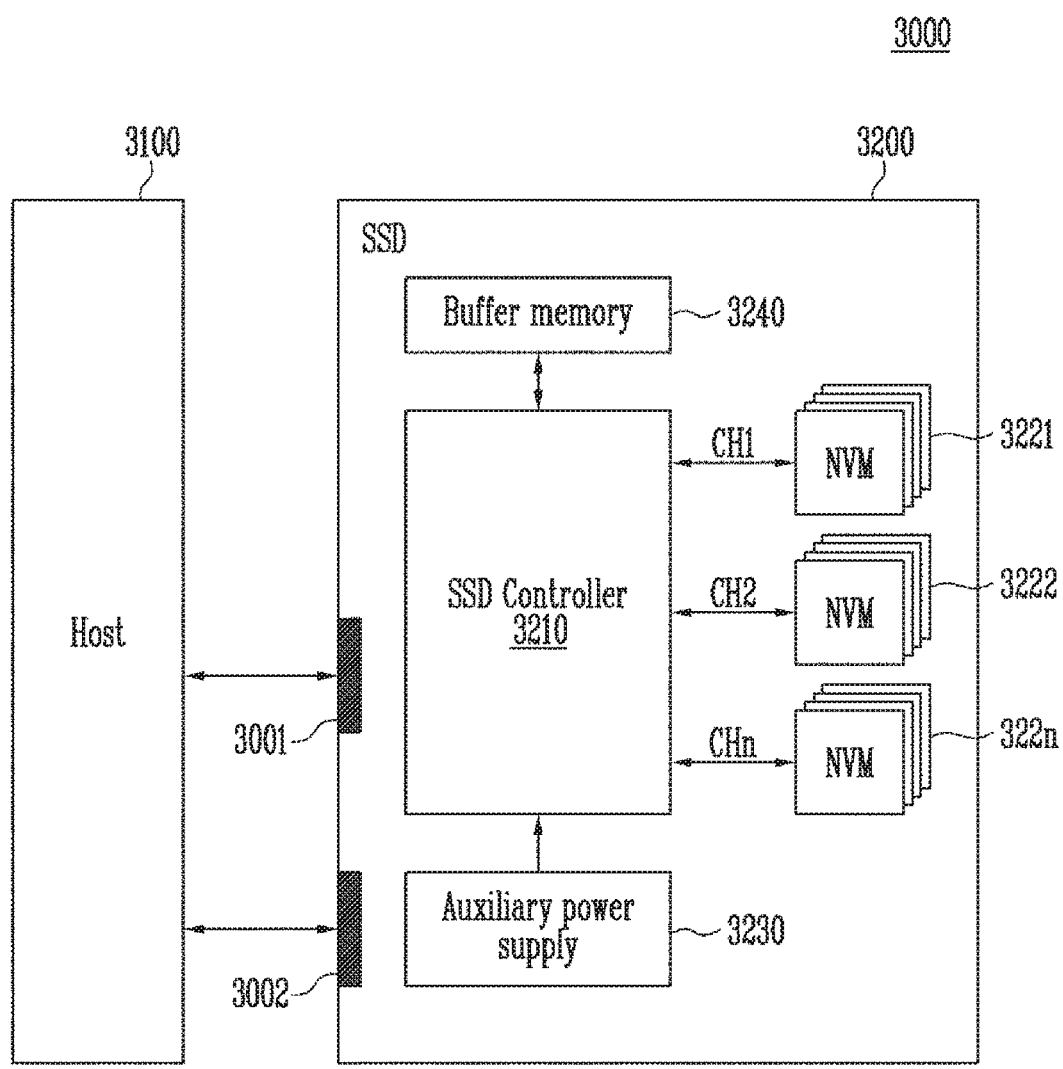
FIG. 14 is a block diagram illustrating an example of a solid state drive (SSD) system to which the storage device according to an embodiment of the present disclosure is applied.

Referring to FIG. 14, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (DATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100 and may be charged. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 15:
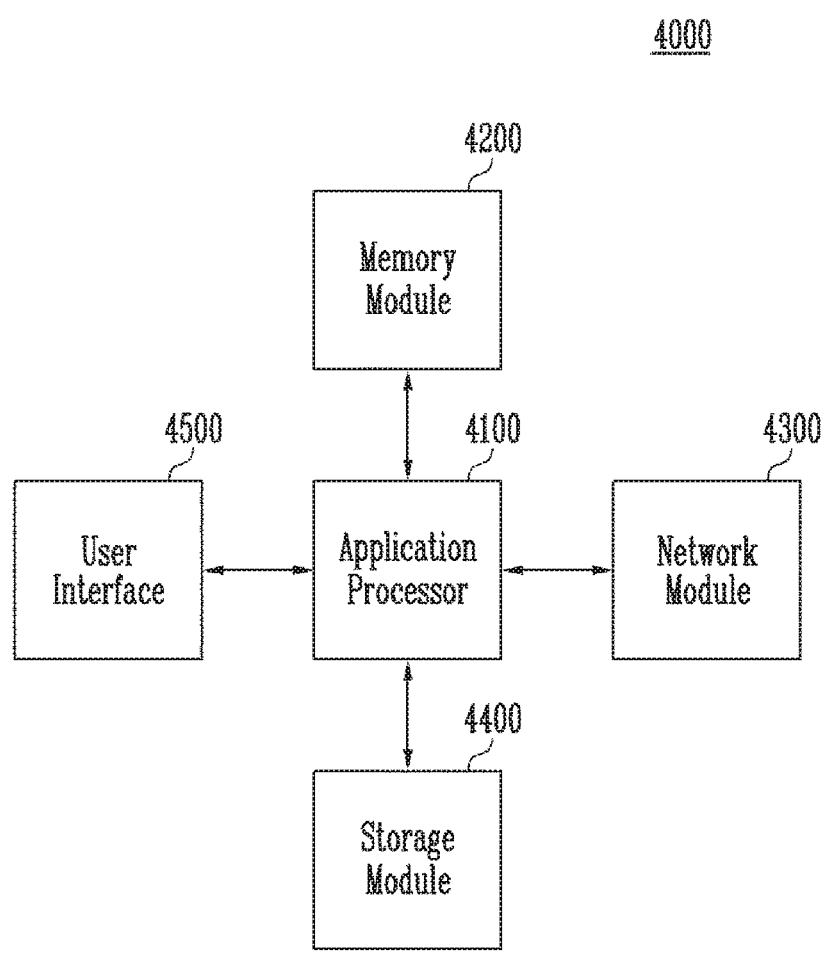
FIG. 15 is a block diagram illustrating a user system to which the storage device according to an embodiment of the present disclosure is applied.

FIG. 15 is a block diagram illustrating a user system to which the storage device according to an embodiment of the present disclosure is applied.

Referring to FIG. 15, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDRAM, and LPDDR3 SDRAM, or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (Le., removable drive), such as a memory card or an external drive of the user system 400.

In an embodiment, the storage module 4400 may include a plurality of nonvolatile memory devices, each of which may be operated in the same way as the memory device described above with reference to FIGS. 8 to 11. The storage module 4400 may be operated in the same way as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

In accordance with the present disclosure, there are provided a memory controller for processing a flush request and a method of operating the memory controller.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not always be sequentially performed in given order, and may be randomly performed. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory controller for controlling a plurality of memory devices, comprising:
    a command processor configured to generate a flush command in response to a flush request input from an external host and to assign a slot number corresponding to the flush command;
    a sequence generator configured to determine flush data, which is data to be stored in response to the flush command, among pieces of write data stored in a write cache buffer, and to generate a write sequence in which the flush data is to be stored based on a size of the flush data and an assigned device sequence of the plurality of memory devices; and
    a memory operation controller configured to control the plurality of memory devices so that program operations of storing the flush data in the plurality of memory devices are performed depending on the write sequence, and to provide the slot number corresponding to the flush command to the command processor.

2. The memory controller according to claim wherein the command processor is configured to store data corresponding to an input write request in the write cache buffer while the program operations are being performed.

3. The memory controller according to claim 1, wherein the command processor is configured to generate a write command corresponding to a write request input from the external host, assign a slot number to the write command, and store the write command to which the slot number is assigned.

4. The memory controller according to claim 3, wherein the command processor comprises a command storage configured to store the write command and the slot number.

5. The memory controller according to claim 1, wherein the flush request is a request to store data corresponding to previously input write requests in the plurality of memory devices.

6. The memory controller according to claim 1, wherein the write cache buffer is a static random access memory (SRAM).

7. The memory controller according to claim 1, wherein the sequence generator includes pieces of device sequence information that are an assigned device sequence of the plurality of memory devices.

8. The memory controller according to claim 7, wherein the sequence generator is configured to determine a last device sequence that is a device sequence of a memory device in which data is to be stored last based on the write sequence.

9. The memory controller according to claim 8, wherein the memory operation controller is configured to store the flush data in the plurality of memory devices until the program operation is performed on a memory device corresponding to the last device sequence.

10. The memory controller according to claim 8, wherein the command processor is configured to, when the slot number corresponding to the flush command is received from the memory operation controller, provide a result of processing the flush request to the external host.

11. The memory controller according to claim 1, wherein the program operations are performed using a data interleaving scheme.

12. A method of operating a memory controller for controlling a plurality of memory devices, the method comprising:
    generating a flush command in response to a flush request received from an external host and assigning a slot number to the flush command;
    determining flush data that is data to be stored in the plurality of memory devices in response to the flush command;
    generating a write sequence in which the flush data is to be stored based on a size of the flush data and an assigned device sequence of the plurality of memory devices; and
    controlling the plurality of memory devices so that program operations of storing the flush data in the plurality of memory devices are performed depending on the write sequence.

13. The method according to claim 12, wherein generating the write sequence is configured to determine a last device sequence that is a device sequence of a memory device in which data is to be stored last based on the write sequence.

14. The method according to claim 13, further comprising, when a program operation performed on a memory device corresponding to the last device sequence is completed, providing a result of processing the flush request to the external host.

15. The method according to claim 12, wherein the program operations are performed using a data interleaving scheme.

16. An operating method of a memory system, the method comprising:
    buffering, in response to one or more requests, one or more commands respectively having a command sequence;
    buffering write data;
    identifying, in response to a flush request, as flush data the buffered write data corresponding to one or more buffered write commands before in the command sequence a buffered flush command corresponding to the flush request;
    selecting one or more among a plurality of memory devices based on a size of the flush data, the memory devices having a device sequence; and controlling the selected memory devices to perform a flush operation with the flush data according to the device sequence in response to the buffered flush command.

* * * * *